United States Patent
Mioki (10) Patent No.: US 10,622,734 B2
(45) Date of Patent: Apr. 14, 2020

(54) METHOD OF MANUFACTURING PROGRAMMABLE CONTROLLER

(71) Applicant: OMRON Corporation, Kyoto (JP)

(72) Inventor: Takamasa Mioki, Moriyama (JP)

(73) Assignee: OMRON Corporation, Kyoto (JP)

( * ) Notice: Subject to any disclaimer, the term of this patent is extended or adjusted under 35 U.S.C. 154(b) by 69 days.

(21) Appl. No.: 15/813,175

(22) Filed: Nov. 15, 2017

(65) Prior Publication Data

US 2018/0219308 A1    Aug. 2, 2018

(30) Foreign Application Priority Data

Feb. 2, 2017  (JP) .................................. 2017-017642

(51) Int. Cl.
    *H01R 9/24* (2006.01)
    *H03K 19/0175* (2006.01)
    *G05B 19/05* (2006.01)
    *G11C 16/10* (2006.01)

(52) U.S. Cl.
    CPC ......... *H01R 9/2458* (2013.01); *G05B 19/056* (2013.01); *G05B 19/058* (2013.01); *H03K 19/017581* (2013.01); *G05B 19/054* (2013.01); *G05B 2219/13161* (2013.01); *G11C 16/10* (2013.01)

(58) Field of Classification Search
    CPC .. G05B 19/054; G05B 19/056; G05B 19/058; G05B 2219/13161; G11C 16/10; H01R 9/2458; H03K 19/017581
    See application file for complete search history.

(56) References Cited

U.S. PATENT DOCUMENTS

| 6,901,298 | B1  | 5/2005  | Govindaraj et al. |
|-----------|-----|---------|-------------------|
| 2005/0270063 | A1 | 12/2005 | Cornett |
| 2006/0092323 | A1* | 5/2006 | Feeler .................. H04N 21/418 348/553 |
| 2009/0249320 | A1* | 10/2009 | Su ............................ G06F 8/65 717/168 |

FOREIGN PATENT DOCUMENTS

| EP | 2869154 | 5/2015 |
| JP | 2004272629 | 9/2004 |

OTHER PUBLICATIONS

"Search Report of European Counterpart Application," dated May 24, 2018, p. 1-p. 8.

* cited by examiner

*Primary Examiner* — Idriss N Alrobaye
*Assistant Examiner* — Richard B Franklin
(74) *Attorney, Agent, or Firm* — JCIPRNET (57) ABSTRACT

A program is simply stored in a storage unit of a programmable controller. A substrate of the programmable controller includes an interface unit to which an external device having input and output terminals is detachably attached and a first storage unit. The interface unit includes a processor circuit and connector terminals to which the input and output terminals of the external device are able to be connected. The method includes: forming a predetermined circuit by connecting the input and output terminals of the external device to the connector terminals; reading a program or data of the programmable controller from a second storage unit in which the program or data is stored and storing the read program or data in the first storage unit; and causing the processor circuit to start the step of reading and storing the program or data when the predetermined circuit has been formed.

10 Claims, 5 Drawing Sheets

METHOD OF MANUFACTURING PROGRAMMABLE CONTROLLER

CROSS-REFERENCE TO RELATED APPLICATION

This application claims the priority benefit of Japanese application serial no. 2017-017642, filed on Feb. 2, 2017. The entirety of the above-mentioned patent application is hereby incorporated by reference herein and made a part of this specification.

BACKGROUND

Technical Field

The disclosure relates to a method of manufacturing a programmable controller and, more particularly, to a manufacturing method including a process step of mounting software of a programmable controller.

Description of Related Art

A programmable logic controller (PLC) (also referred to as a programmable controller) is known as an example of a device relevant to factory automation (FA) for controlling facilities or machines.

A PLC manages production process steps in FA using a program which is executed or controls another relevant device. Accordingly, for example, when production process steps or control specifications are changed, the program which is executed by the PLC needs to be changed. For example, a method described in Patent Document 1 (Japanese Unexamined Patent Application Publication No. 2004-272629) has been proposed as a method of changing a program of a PLC.

In Patent Document 1, generally, an operator changes a PLC to a program transmission mode using a DIP switch or the like such that details in a memory are rewritten to change a program of the PLC. Subsequently, an object code is downloaded. Accordingly, the object code is stored in a memory of the PLC in which a program is stored.

However, since the DIP switch is generally small, an operator has difficulty in operating the DIP switch and is likely to cause an operation mistake.

[Patent Document 1] Japanese Unexamined Patent Application Publication No. 2004-272629

SUMMARY

According to an aspect of the invention, there is provided a method of manufacturing a programmable controller. The programmable controller includes a substrate, the substrate includes an interface unit to which an external device having input and output terminals is detachably attached and a first storage unit, and the interface unit includes a processor circuit and connector terminals to which the input and output terminals of the external device are able to be connected.

The method includes: a step of forming a predetermined circuit by connecting the input and output terminals of the external device to the connector terminals; a step of reading a program or data of the programmable controller from a second storage unit in which the program or data is stored and storing the read program or data in the first storage unit; and a step of causing the processor circuit to start the step of reading and storing the program or data when the predetermined circuit has been formed.

According to another aspect of the invention, there is provided a programmable controller. The programmable controller includes a substrate, the substrate includes an interface unit to which an external device having input and output terminals is detachably attached, a processor, a main storage unit, and a first storage unit, and the interface unit includes a processor circuit and connector terminals to which the input and output terminals of the external device are able to be connected.

The processor circuit includes: a first storage processing unit that reads a program or data of the programmable controller from a second storage unit in which the program or data is stored and stores the read program or data in the first storage unit when a predetermined circuit has been formed by connecting the input and output terminals of the external device to the connector terminals at the time of starting the programmable controller; and a second storage processing unit that reads the program or data of the programmable controller stored in the first storage unit and stores the read program or data in the main storage unit when the predetermined circuit has not been formed at the time of starting the programmable controller.

According to still another aspect of the invention, there is provided a method of switching an operation mode of a programmable controller The programmable controller includes a substrate, the substrate includes an interface unit to which an external device having input and output terminals is detachably attached, a processor, a main storage unit, and a first storage unit, and the interface unit includes a processor circuit and connector terminals to which the input and output terminals of the external device are able to be connected.

The method includes: a step of forming a predetermined circuit by connecting the input and output terminals of the external device to the connector terminals at the time of starting the programmable controller; a first step of causing the processor circuit to read a program or data of the programmable controller from a second storage unit in which the program or data is stored and to store the read program or data in the first storage unit when the predetermined circuit has been formed at the time of starting the programmable controller; and a second step of causing the processor circuit to read the program or data of the programmable controller stored in the first storage unit and to store the read program or data in the main storage unit when the predetermined circuit has not been formed at the time of starting the programmable controller.

DESCRIPTION OF THE EMBODIMENTS

The invention is made in consideration of the above-mentioned circumstances and an object of an aspect of the invention is to provide a method of manufacturing a programmable controller which enables a storage unit of the programmable controller to simply store a program.

According to one or some exemplary embodiments of the invention, the step of reading and storing the program or data includes a step of executing a command for reading the program of the programmable controller from the second storage unit and storing the read program in the first storage unit.

According to one or some exemplary embodiments of the invention, the step of executing the command includes a step of causing the processor circuit to execute the command.

According to one or some exemplary embodiments of the invention, the substrate includes a processor, and the step of executing the command includes a step of causing the processor circuit to command the processor to execute the command.

According to one or some exemplary embodiments of the invention, the method further includes a step of outputting a notification indicating that the predetermined circuit is formed via an output unit.

According to one or some exemplary embodiments of the invention, the second storage unit includes a storage medium that is detachably attached to the substrate. According to one or some exemplary embodiments of the invention, the second storage unit is disposed in the external device.

According to the aspects of the invention, it is possible to simply store a program in a storage unit of a programmable controller.

Hereinafter, embodiments of the invention will be described with reference to the accompanying drawings. The same elements and corresponding elements will be referenced by the same reference signs and description thereof may not be repeated.

First Embodiment

Whole Configuration

Figure 1:
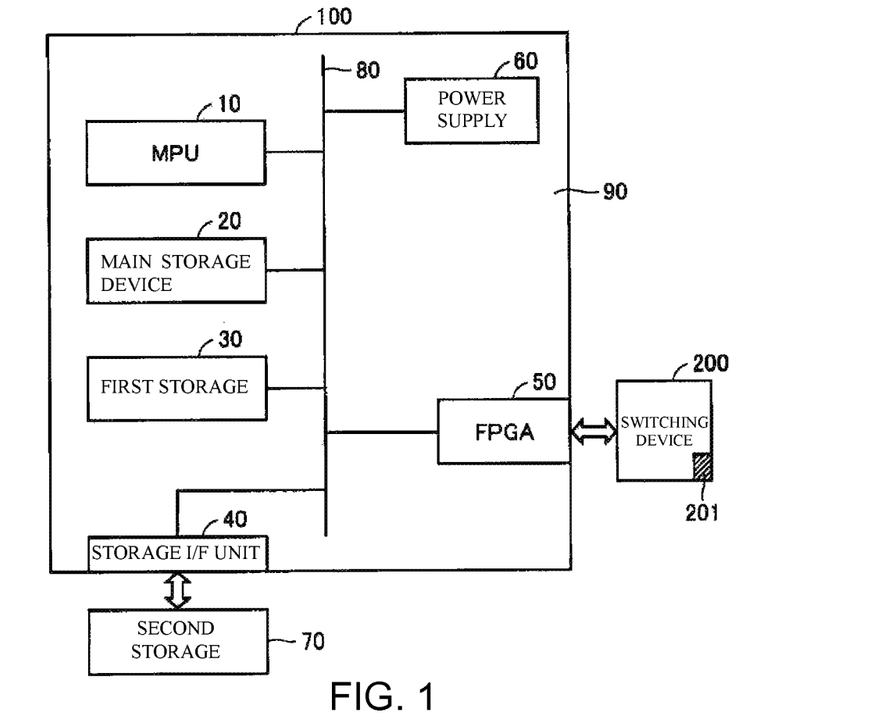
FIG. 1 is a diagram illustrating a configuration of a PLC according to a first embodiment in association with peripheral devices.
Figure 2A:
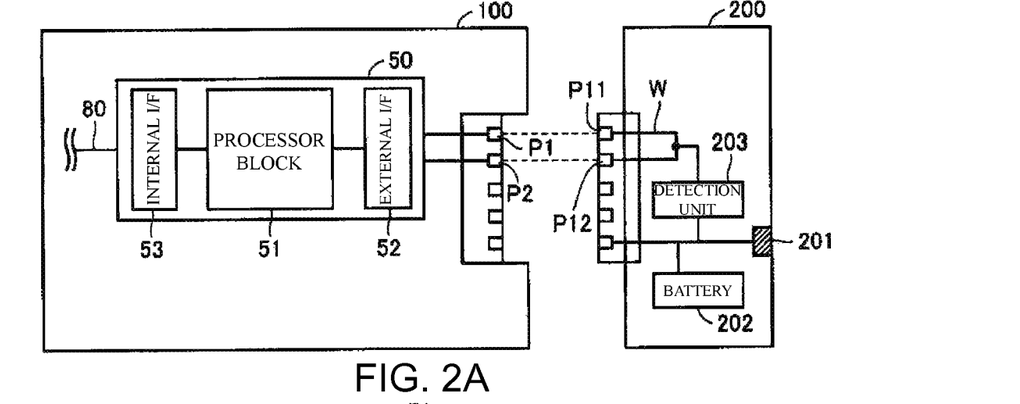
FIGS. 2A and 2B are diagrams illustrating a configuration of an FPGA 50 according to the first embodiment in association with a switching device 200.
Figure 2B:
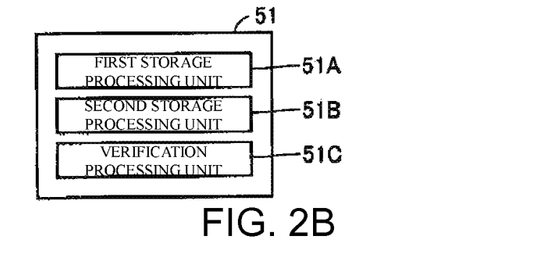

FIG. 1 is a diagram illustrating a configuration of a PLC according to a first embodiment in association with peripheral devices. FIGS. 2A and 2B are diagrams illustrating a configuration of an FPGA 50 according to the first embodiment in association with a switching device 200.

Referring to FIG. 1, a PLC 100 includes a substrate 90. A micro-processing unit (MPU) 10, a main storage device 20, a first storage 30 which is an example of a "first storage unit," a storage interface (I/F) unit 40, a field programmable gate array (FPGA) 50 which is an example of an "interface unit," a power supply 60, and a bus 80 are mounted on the substrate 90.

The main storage device 20 includes a read only memory (ROM) and a random access memory (RAM) in which a program or data which is read and executed by the MPU 10 is stored. A second storage 70 which is an external storage medium can be detachably attached to the storage I/F unit 40. The second storage 70 is an example of a "second storage unit." A switching device 200 which is an example of an "external device" can be detachably attached to the FPGA 50. The power supply 60 supplies electric power to the units of the PLC 100. The units can input and output data to each other via the bus 80.

The first storage 30 is a nonvolatile storage device which is built in the PLC 100 and includes, for example, a NAND type flash memory. The second storage 70 is an external storage device of the PLC 100 and includes, for example, an SD memory card. The program or data which is stored in the first storage 30 and the second storage 70 includes a program or data for starting the PLC 100. The program or data for starting the PLC 100 is hereinafter also referred to as system starting data 71.

Referring to FIG. 2A, the FPGA 50 mainly includes a processor block 51 including programmable logic elements and an external interface (I/F) 52 and an internal interface (I/F) 53 including programmable input and output elements. A hardware block such as a digital signal processor or a clock generator circuit may be mounted on the FPGA 50. The FPGA 50 operates as a circuit based on a design by downloading design data to the processor block 51, the external I/F 52, and the internal I/F 53 which are the programmable elements. The design data includes description data of a program for implementing processes based on the flowchart illustrated in FIG. 4 which will be described later.

The processor block 51 is an example of a "processor circuit." The external I/F 52 includes connector terminals (pins) P1 and P2 to which input and output terminals of the external device such as the switching device 200 can be connected. The internal I/F 53 includes one or more terminals (pins) for connection to the bus 80. The external I/F 52 and the internal I/F 53 input and output, for example, data of one or more bits via the corresponding one or more terminals (pins). The processor block 51 processes data from the external I/F 52 or the internal I/F 53 and outputs the processed data via the external I/F 52 or the internal I/F 53.

The switching device 200 includes a light emitting diode (LED) 201, a battery 202 that supplies electric power to the units of the switching device 200, a terminal unit including terminals (pins) P11 and P12, and a detection unit 203. In the switching device 200, the terminal P11 is connected to the terminal P12 via a wire W. The detection unit 203 detects a voltage applied to the terminals P11 and P12 from the wire W and controls turning on/off of the LED 201 based on the detected voltage.

The terminal unit of the switching device 200 has a shape which can be fitted to the shape of the external I/F 52. When the switching device 200 is attached to the FPGA 50 by an operator fitting the terminal unit of the switching device 200 to the external I/F 52, a predetermined circuit of the connector terminal P1 of the FPGA 50→the terminal P11 of the switching device 200→the wire W→the terminal P12 of the switching device 200→the connector terminal P2 of the FPGA 50 is set up. When an operator detaches the terminal unit of the switching device 200 from the external I/F 52, the terminals P11 and P12 of the switching device 200 are separated from the connector terminals P1 and P2 of the FPGA 50 and the setup of the predetermined circuit is released.

Specifically, when the switching device 200 is attached to the FPGA 50 and the predetermined circuit is set up, the connector terminals P1 and P2 of the FPGA 50 are short-circuited (connected). On the other hand, when the switching device 200 is detached from the FPGA 50 and the setup of the predetermined circuit is released, the connector terminals P1 and P2 are opened (disconnected).

A voltage which is applied to the detection unit 203 of the switching device 200 via the wire W has different voltage values when the predetermined circuit is set up and when the setup of the predetermined circuit is released. Accordingly, the detection unit 203 compares the voltage value of the wire W with a first threshold value (which corresponds to the value of the short-circuit voltage) and turns on or off the LED 201 based on the comparison result. For example, when the switching device 200 is attached to the FPGA 50 (the predetermined circuit is set up) and the connector terminals P1 and P2 are short-circuited, the detection unit 203 turns on the LED 201 based on the comparison result of the voltages (two voltage values match each other). When the switching device 200 is detached from the FPGA 50 (the predetermined circuit is not set up) and the connector terminals P1 and P2 are opened, the detection unit 203 turns off the LED 201 based on the comparison result of the voltages (two voltage values do not match each other).

An operator can determine whether the switching device 200 is attached to the FPGA 50 based on turning-on/off of the LED 201.

FIG. 2B schematically illustrates functional blocks disposed in a circuit of the processor block 51 of the FPGA 50. The processor block 51 includes a first storage processing unit 51A that reads a program or data from the second storage 70 and stores read details in the first storage 30 when the predetermined circuit has been set up, a second storage processing unit 51B that reads a program or data from the first storage 30 and stores the read details in the main storage device 20 when the predetermined circuit has not been set up, and a verification processing unit 51C. The verification processing unit 51C performs a verification process (Verify) which will be described later to determine whether the storage process by the first storage processing unit 51A has succeeded.

Exterior

Figure 3:
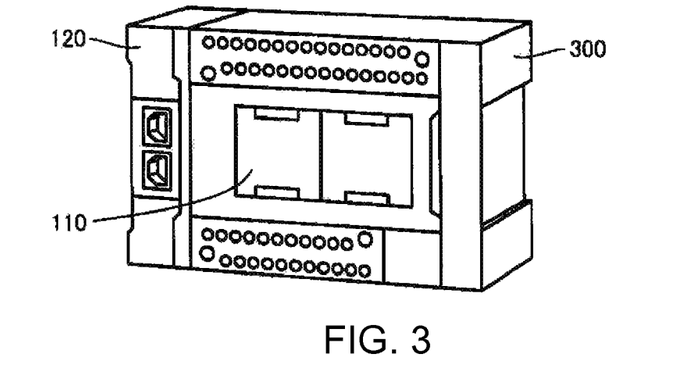
FIG. 3 is a diagram illustrating an exterior of a PLC unit 300 according to the first embodiment.

FIG. 3 is a diagram illustrating an exterior of a PLC unit 300 according to the first embodiment. Referring to FIG. 3, the PLC unit 300 includes a housing in which the PLC 100 illustrated in FIG. 1 is incorporated. The housing includes a portion 110 in which an option board of the PLC 100 (a board of an external device for realizing an optional function) is detachably attached to the substrate 90 and a portion 120 in which a backup memory card for data of the PLC 100 is detachably attached to the substrate 90. In the first embodiment, the portion 110 is used to attach the board of the switching device 200 and the portion 120 is used to detachably attach the second storage 70.

Process Flow

Figure 4:
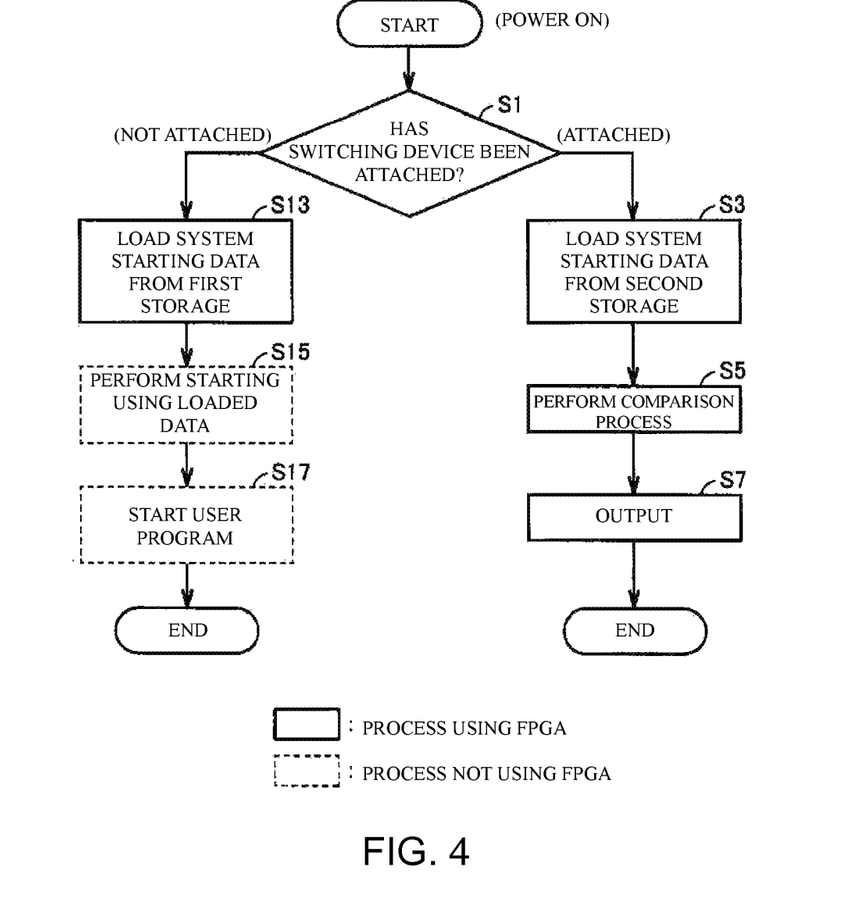
FIG. 4 is a flowchart illustrating a process routine including loading system starting data 71 of the PLC 100 according to the first embodiment.

FIG. 4 is a flowchart illustrating a process flow including loading the system starting data 71 of the PLC 100 according to the first embodiment. In the first embodiment, "loading" refers to a process of reading data from a storage unit and writing the read data to another storage unit.

Figure 5:
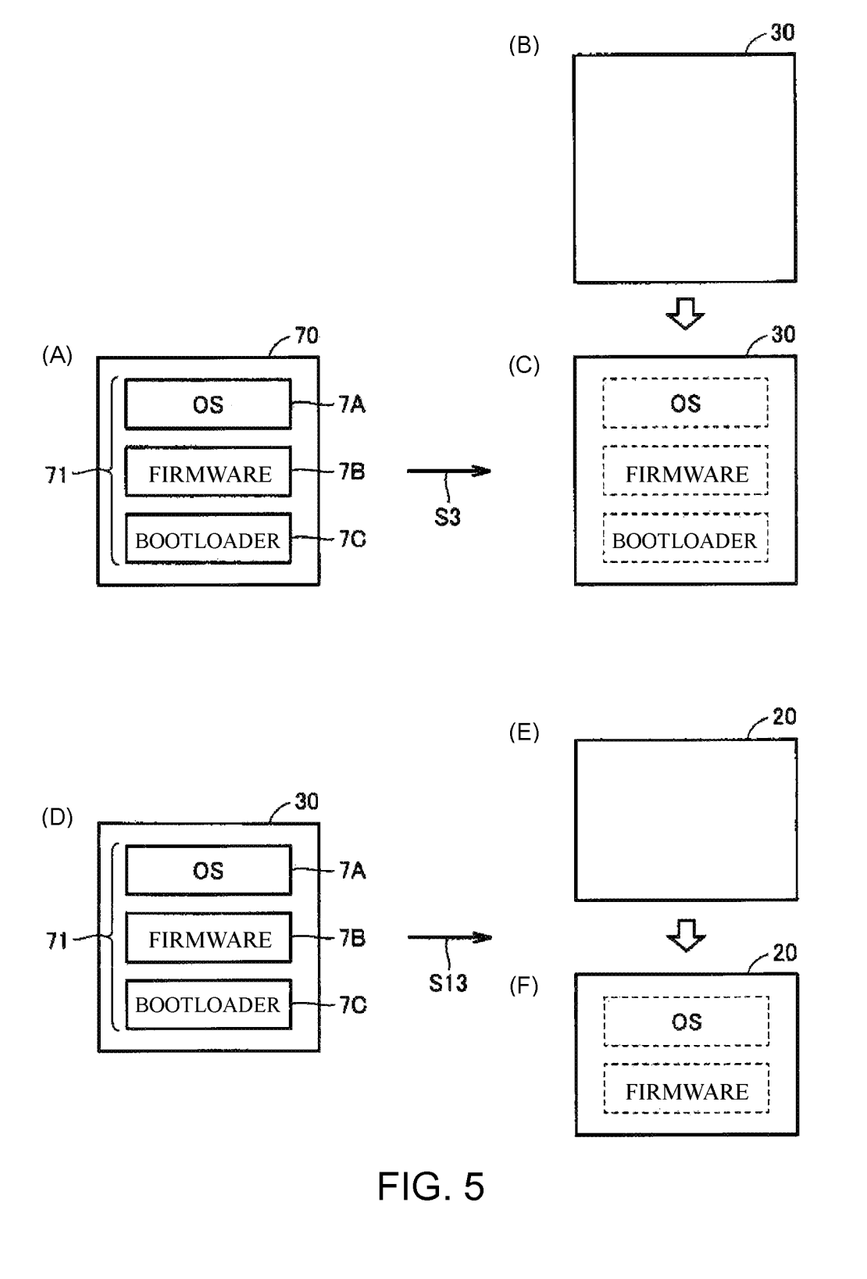
FIG. 5 is a diagram illustrating a change of details stored in a storage unit according to the first embodiment.

FIG. 5 is a diagram illustrating a change of details stored in the storage units. Referring to (A) of FIG. 5, the system starting data 71 according to the first embodiment includes a system program such as an operating system (OS) 7A and firmware 7B and a bootloader 7C that loads (stores) the system program to the main storage device 20. The system starting data 71 may include various data in addition to the program.

The process flow illustrated in FIG. 4 will be described below with reference to FIG. 5. An operator turns on the power supply of the PLC 100 and attaches the switching device 200 (see (A) of FIG. 5) in which the system starting data 71 is stored to the storage OF unit 40 such that the switching device 200 can be detached from the PLC 100. The switching device 200 may be detachably attached before the power supply of the PLC 100 is turned on.

The processor block 51 starts the process flow illustrated in FIG. 4 when the power supply is turned on. First, the processor block 51 determines whether the switching device 200 has been attached (the predetermined circuit has been set up) (Step S1). Specifically, the determination is performed by the processor block 51 comparing the voltages of the connector terminals P1 and P2 received via the external I/F 52 with a short-circuit voltage and determining whether the short-circuit voltage has been received from the connector terminals P1 and P2 based on the comparison result.

The processor block 51 starts the first storage processing unit 51A when the short-circuit voltage of the connector terminals P1 and P2 has been received via the external I/F 52, that is, when the switching device 200 has been attached ("attached" in Step S1). The started first storage processing unit 51A starts loading the system starting data 71 from the second storage 70 (Step S3). Specifically, the first storage processing unit 51A starts a process of reading the system starting data 71 from the second storage 70 and storing (writing) the read details in the first storage 30. When the loading of the system starting data 71 to the first storage 30 is completed, details of the first storage 30 are changed from (B) of FIG. 5 to (C) of FIG. 5.

The verification processing unit 51C of the processor block 51 performs a process of comparing the system starting data 71 in the second storage 70 with system starting data in the first storage 30 as a loading destination to verify whether the loading has succeeded (Step S5).

The verification processing unit 51C performs the comparison process, for example, using checksum. In the first embodiment, the processor block 51 reads data (for example, binary data) in an address area of the second storage 70 in which the system starting data 71 is stored, calculates a sum thereof, reads data (for example, binary data) in an address area of the first storage 30 in which the system starting data is stored, and calculates a sum thereof. The verification processing unit 51C compares the calculated sums. In the first embodiment, data designating the address area of the second storage 70 in which the system starting data 71 is stored and the address area of the first storage 30 in which the system starting data is stored is stored in advance in the processor block 51.

The verification processing unit 51C outputs data indicating that the loading succeeds when the comparison result of the sums represents that both match, and outputs data indicating that the loading fails when the comparison result of the sums represents that both do not match (Step S9).

The verification processing unit 51C outputs, for example, the data indicating that the loading succeeds or fails to the switching device 200 via the external I/F 52. The switching device 200 changes a turning-on mode (for example, a flickering cycle or a lighting color) of the LED 201 based on the data indicating that the loading succeeds or fails from the verification processing unit 51C. An operator can confirm loading success/failure of the system starting data 71 from the turning-on mode of the LED 201.

The comparison process is not limited to the method using the checksum. The verification process is not limited to the above-mentioned comparison process.

A case in which the switching device 200 is not attached to the PLC 100 will be described below. When the power supply of the PLC 100 is turned on, the voltage which the processor block 51 receives from the connector terminals P1 and P2 via the external I/F 52 is not the short-circuit voltage ("not attached" in Step S1). The processor block 51 compares the voltage received from the connector terminals P1 and P2 with the short-circuit voltage and starts the second storage processing unit 51B when the comparison result results mismatch. The started second storage processing unit 51B starts loading the system starting data 71 from the first storage 30 (Step S13). Specifically, the second storage processing unit 51B outputs a starting command to the bootloader 7C (see (D) of FIG. 5) of the first storage 30 via the internal OF 53.

The bootloader 7C which is started in accordance with the starting command from the second storage processing unit 51B reads the OS 7A and the firmware 7B from the first storage 30 and stores the read details in the main storage device 20. When loading of the system starting data (more specifically, the system program) from the first storage 30 is completed, details of the main storage device 20 are changed from (E) of FIG. 5 to (F) of FIG. 5.

Thereafter, the bootloader 7C of the first storage 30 starts the OS 7A of the main storage device 20 (Step S15). When the OS 7A is started, the MPU 10 starts the user program under the control of the OS 7A (Step S17).

In the process flow illustrated in FIG. 4, the system starting data 71 of the second storage 70 is loaded to the first storage 30 when the switching device 200 is attached, and the system starting data 71 (more specifically, the system program) of the first storage 30 is loaded to the main storage device 20 when the switching device 200 is not attached. Accordingly, an operator can perform loading of the system starting data 71 while switching the storage unit as a loading source and the storage unit as a loading destination by performing a simple operation of attaching or detaching the switching device 200 to or from the portion 110 of the PLC unit 300.

In the first embodiment, the FPGA 50 is used as a circuit for starting loading when the switching device 200 is detachably attached, but an application specific integrated circuit (ASIC) may be used or a combination of the FPGA 50 and the ASIC may be used.

Switching of Operation Mode

The process flow illustrated in FIG. 4 can be applied as a method of switching the operation mode at the time of starting of the PLC 100. That is, in this method, when the predetermined circuit is set up at the start time at which the power supply of the PLC 100 is turned on, the first storage processing unit 51A is started and performs a first operation mode of reading the system starting data 71 from the second storage 70 and storing the read system starting data 71 in the first storage 30. On the other hand, when the predetermined circuit is not set up at the start time at which the power supply turned on, the second storage processing unit 51B is started and performs a second operation mode of reading the system starting data 71 (more specifically, the system program) stored in the first storage 30 and storing the read system starting data 71 in the main storage device 20.

In this way, an operator can switch the operation mode at the time of starting of the PLC 100 by a simple operation of attaching/detaching the switching device 200 to/from the portion 110 of the PLC unit 300.

Second Embodiment

Figure 6:
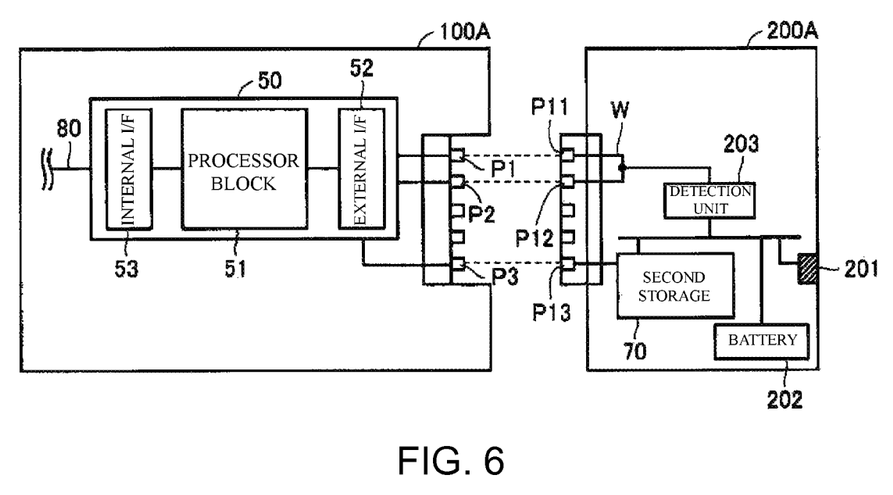
FIG. 6 is a diagram illustrating a configuration of a PLC according to a second embodiment in association with peripheral devices.

A second embodiment is a modified example of the first embodiment. FIG. 6 is a diagram illustrating a configuration of a PLC according to a second embodiment in association with peripheral devices. In the first embodiment, the second storage 70 is provided in the PLC 100, but may be provided in the switching device 200 as illustrated in FIG. 6.

In FIG. 6, unlike the configuration illustrated in FIG. 1, a configuration in which a switching device 200A including the second storage 70 is detachably attached to a PLC 100A not including the second storage 70 is illustrated. The other configuration in FIG. 6 is the same as in FIG. 1 and thus description thereof will not be repeated.

Referring to FIG. 6, the external I/F 52 of the FPGA 50 includes connector terminals (pins) P1, P2, and P3 to which input and output terminals of an external device such as the switching device 200A can be connected.

The terminal unit of the switching device 200A includes terminals (pins) P11 and P12, and a terminal (a pin) P13 connected to the second storage 70.

When an operator fits the terminal unit of the switching device 200A to the external I/F 52 and the switching device 200A is attached to the FPGA 50, the predetermined circuit is set up and the terminal P13 is connected to the connector terminal P3. Accordingly, the first storage processing unit 51A of the processor block 51 can load data from the second storage 70 of the switching device 200A to the first storage 30 via the connector terminal P3 and the terminal P13.

Third Embodiment

Figure 7A:
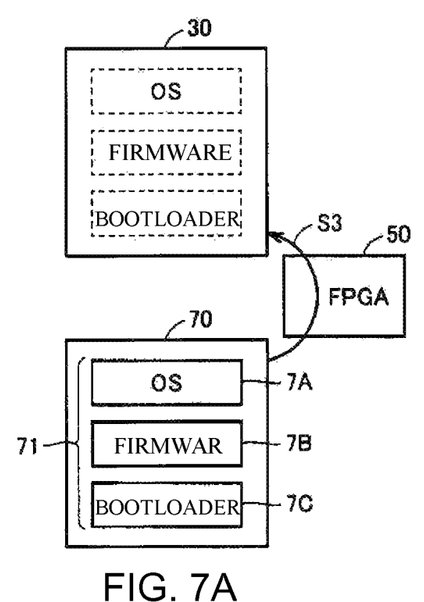
FIGS. 7A, 7B and 7C are diagrams illustrating a third embodiment.
Figure 7B:
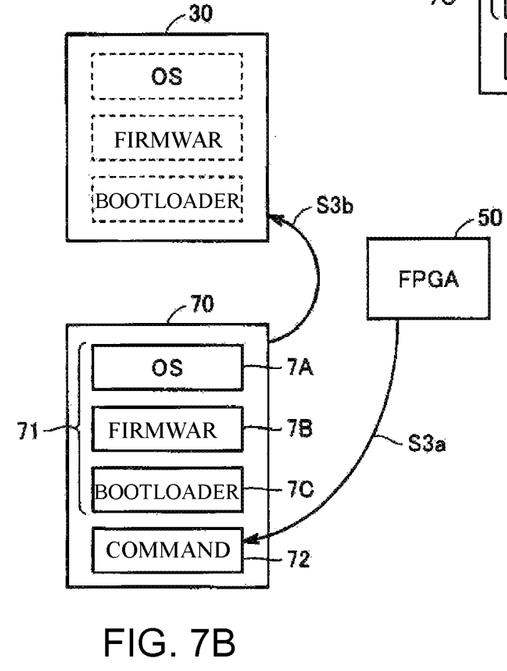
Figure 7C:
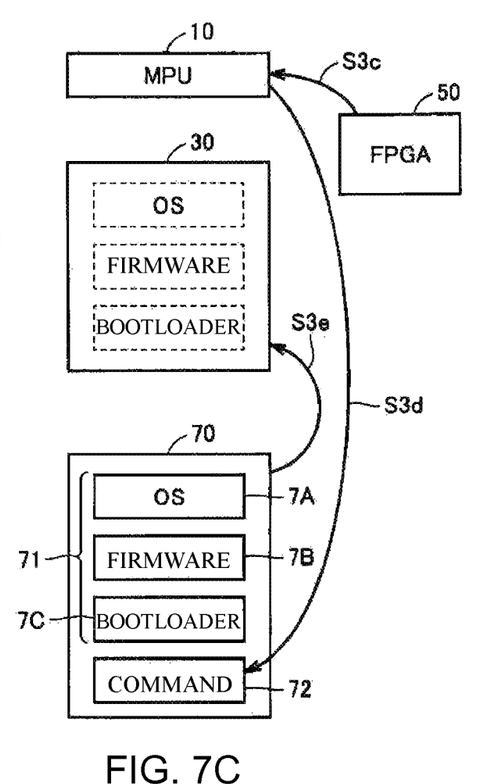

A third embodiment is a modified example of the first or second embodiment. FIGS. 7A to 7C are diagrams illustrating the third embodiment. In the above-mentioned embodiments, loading of the system starting data 71 (Step S3 in FIG. 4) is performed by only the FPGA 50, but may be performed by the FPGA 50 in cooperation with another device or the like.

FIG. 7A illustrating the method in Step S3 described above in the first embodiment. Referring to FIG. 7A, the FPGA 50 (the first storage processing unit 51A) reads the system starting data 71 from a predetermined address area of the second storage 70 and stores (writes) the read details in a predetermined address area of the first storage 30.

On the other hand, as illustrated in FIG. 7B, loading of the system starting data 71 (step S3 in FIG. 4) may be performed using a loading command 72 stored in the second storage 70.

Specifically, when the power supply of the PLC 100 is turned on, the first storage processing unit 51A is started. The first storage processing unit 51A performs loading (Step S3b) by executing the loading command 72 of the second storage 70 (Step S3a). In this case, information indicating an address of the second storage 70 from which the system starting data 71 is read and an address of the first storage 30 to which the read system starting data 71 is written can be set in the loading command 72.

As illustrated in FIG. 7C, a configuration in which loading of the system starting data 71 (Step S3 in FIG. 4) is performed by the MPU 10 may be employed. Specifically, when the power supply of the PLC 100 is turned on, the first storage processing unit 51A is started. When the first storage processing unit 51A is started, the MPU 10 is started and a command for executing the loading command 72 of the second storage 70 is issued to the MPU 10 (Step S3c). The MPU 10 executes the loading command 72 of the second storage 70 in accordance with the command from the first storage processing unit 51A (Step S3d). Accordingly, the loading is performed (Step S3e).

The loading methods illustrated in FIGS. 7A to 7C may be applied to loading of the system starting data from the first storage 30 to the main storage device 20 by the second storage processing unit 51B (Step S13 in FIG. 4).

According to the above-mentioned embodiments, updating of details of the storage unit for changing a program of the PLC 100 can be performed by attaching the switching device 200 to the FPGA 50, not by an operation of a DIP switch as described in Patent Document 1. Accordingly, it is possible to realize changing of a program of the PLC 100 with a simple operation.

When the PLC 100 is manufactured (produced) by loading of the system starting data 71 in the embodiments, manufacturing of a PLC can be realized with a simple operation and it is thus possible to improve manufacturing efficiency of the PLC in comparison with a case in which a small DIP switch is operated.

The above-disclosed embodiments should be understood to be merely exemplary, but not restrictive in all aspects. The scope of the invention is defined by the appended claims, not by the above description, and is intended to include all modifications within meanings and scopes equivalent to the scope of the claims.

What is claimed is:

1. A method of manufacturing a programmable controller, the programmable controller including a substrate, the substrate including an interface unit to which an external device having input and output terminals is detachably attached and a first storage unit, the interface unit including a processor circuit, a first connector terminal and a second connector terminal, wherein the first and second connector terminals are configured to connect to the input and output terminals of the external device, the method comprising:
   forming a predetermined circuit by connecting the input and output terminals of the external device to the first and second connector terminals;
   determining the formation of the predetermined circuit by comparing a voltage received at the first connector terminal and a voltage received at the second connector terminal with a predetermined short-circuit voltage; and
   causing the processor circuit to load a program or data of the programmable controller from a second storage unit to the first storage unit through a third connector terminal connecting the programmable controller to the second storage unit when determined that the predetermined circuit is formed.

2. The method according to claim 1, wherein the step of causing the processor circuit to load the program or data includes executing a command for reading the program of the programmable controller from the second storage unit and storing the read program in the first storage unit.

3. The method according to claim 2, wherein the step of executing the command includes causing the processor circuit to execute the command.

4. The method according to claim 2, wherein the substrate includes a processor, and
   the step of executing the command includes causing the processor circuit to command the processor to execute the command.

5. The method according to claim 1, further comprising outputting a notification indicating that the predetermined circuit is formed via an output unit.

6. The method according to claim 1, wherein the second storage unit includes a storage medium that is detachably attached to the substrate.

7. The method according to claim 1, wherein the second storage unit is disposed in the external device.

8. The method of manufacturing a programmable controller of claim 1, wherein the step of forming the predetermined circuit comprises:
   forming the predetermined circuit by connecting the first connector terminal of the interface unit to the second connector terminal of the interface unit through a first input and output terminal of the external device, a second input and output terminal of the external device, and a wire connecting the first and second input and output terminals of the external device together.

9. A programmable controller comprising a substrate,
   wherein the substrate includes an interface unit to which an external device having input and output terminals is detachably attached, a processor, a main storage unit, and a first storage unit,
   wherein the interface unit includes a processor circuit, a first connector terminal and a second connector terminal the input and output terminals of the external device are configured to be connected, and
   wherein the processor circuit determines whether a predetermined circuit is formed between the first and second connector terminals of the interface unit through the input and output terminals and a wire of the external device and includes:
      a first storage processing unit that reads a program or data of the programmable controller from a second storage unit in which the program or data is stored and stores the read program or data in the first storage unit when determined that a predetermined circuit is formed between the first and second connector terminals through the input and output terminals of the external device at a power on of the programmable controller; and
      a second storage processing unit that reads the program or data of the programmable controller stored in the first storage unit and stores the read program or data in the main storage unit when determined that the predetermined circuit between the first and second connector terminals is not formed at the power on of the programmable controller.

10. A method of switching an operation mode of a programmable controller, the programmable controller including a substrate, the substrate including an interface unit to which an external device having input and output terminals is detachably attached, a processor, a main storage unit, and a first storage unit, the interface unit including a processor circuit, a first connector terminal and a second connector terminal, wherein the first and second connector terminals are configured to connect to the input and output terminals of the external device, the method comprising:
   forming a predetermined circuit by connecting the input and output terminals of the external device to the first and second connector terminals;
   determining the formation of the predetermined circuit by comparing a voltage received at the first connector terminal and a voltage received at the second connector terminal with a predetermined short-circuit voltage;
   causing the processor circuit to load a program or data of the programmable controller from a second storage unit to the first storage unit through a third connector terminal connecting the programmable controller to the second storage unit when the predetermined circuit has been formed at a power on of the programmable controller; and
   causing the processor circuit to load the program or data of the programmable controller from the first storage unit to the main storage unit when the predetermined circuit has not been formed at the power on of the programmable controller.

* * * * *